United States Patent [19]

Lowery et al.

[11] Patent Number: 5,509,022
[45] Date of Patent: Apr. 16, 1996

[54] SELF-TUNED MODE-LOCKED LASER

[75] Inventors: Arthur J. Lowery, Kew; Rodney S. Tucker, Hawthorn; Noriaki Onodera, Elsternwick, all of Australia

[73] Assignee: The University of Melbourne, Victoria, Australia

[21] Appl. No.: 211,093

[22] PCT Filed: Sep. 18, 1992

[86] PCT No.: PCT/AU92/00496

§ 371 Date: Jun. 10, 1994

§ 102(e) Date: Jun. 10, 1994

[87] PCT Pub. No.: WO93/06642

PCT Pub. Date: Apr. 1, 1993

[30] Foreign Application Priority Data

Sep. 20, 1991 [AU] Australia .................................. PK8508

[51] Int. Cl.⁶ .................................................. H01S 3/098
[52] U.S. Cl. ............................. 372/18; 372/29; 372/32; 372/20
[58] Field of Search ..................... 372/92, 25, 29, 372/32, 18, 20

[56] References Cited

U.S. PATENT DOCUMENTS

| | | | |
|---|---|---|---|
| 4,410,992 | 10/1983 | Javan | 372/20 |
| 4,847,584 | 7/1989 | Van Dijk | 372/29 |
| 5,204,640 | 4/1993 | Logan, Jr. | 372/32 |
| 5,263,039 | 11/1993 | Skupsky et al. | 372/25 |

*Primary Examiner*—Leon Scott, Jr.
*Attorney, Agent, or Firm*—Keck, Mahin & Cate

[57] ABSTRACT

A self-tuning mode locked semi-conductor laser automatically adjusts itself to produce short (less than 200 ps and preferably less than 50 ps) stable optical pulses. Tuning is achieved by means of a feedback loop which includes a spectrum analyzer (18) which receives a small amount of the optical output of the laser and monitors the spectral wavelength, spectral width or spectral shape of the output. A controller (19) is connected to said analyzer and produces a control signal based on said spectral information. The control signal causes adjustment of one or more parameters influencing operation of said laser, such as frequency or power of an RF drive signal, level of dc bias, cavity length, for example, in order to produce said short stable pulses.

23 Claims, 3 Drawing Sheets

SELF-TUNED MODE-LOCKED LASER

The present invention relates to a mode-locked laser and more particularly to a mode-locked laser incorporating a control system for producing short, stable optical pulses with known properties. The invention also relates to a method of controlling a mode-locked laser to produce such pulses.

Recently much progress has been made with lasers towards producing short optical pulses, and pulse widths down to fractions of a picosecond have been reported. A limit to the performance of systems employing short optical pulses is amplitude, timing and wavelength instability of the pulses, often known as jitter. Such amplitude, timing and spectral instabilities would result in systems being unworkable because of such problems as intersymbol interference and degraded receiver sensitivities in communications systems, accuracy limitations in instrumentation and errors in optical computers, for example.

A low jitter level is critically dependent on the operating conditions of the laser and in particular on the detuning (or offset) of the RF drive frequency from the external cavity fundamental resonance frequency or a harmonic of this frequency. Ideally, a mode-locked laser system should produce stable pulses, that is, pulses should have constant amplitudes, wavelengths, shapes and timings with respect to a reference. To obtain this stability requires tuning of the mode-locked laser cavity length for a given drive frequency. In the laboratory such tuning is usually achieved by monitoring the pulse using either an oscilloscope or a streak camera. Both the oscilloscope and the streak camera produce plots of pulse amplitude versus time, that is, they operate in the time-domain. Because the optical pulses are short (less than 100 ps) the oscilloscope and the streak camera must be capable of measurements with extremely good time resolution. Such equipment is costly and non-portable,.

Because of the high cost and non-portability of monitoring or tuning equipment, a portable, inexpensive and reliable mode-locked laser control system for producing short pulses has not previously been possible, although the many uses of such a laser source have been readily apparent.

Accordingly, it is an object of this invention to provide a relatively inexpensive and portable mode-locked laser incorporating a control system for automatically producing short stable pulses with known properties.

It is also an object to provide a method of controlling a mode-locked laser so as to automatically produce short, stable pulses with known properties in a relatively inexpensive and portable manner.

The invention therefore provides a mode-locked semiconductor laser including a tuning circuit for producing short stable pulses, characterised in that, said tuning circuit comprises a feedback loop (18,19,20) connected to the optical output (15) of the laser, said feedback loop including an optical spectrum analyser (18) for monitoring the optical spectrum of said output to obtain spectral information and a controller (19) connected to said spectrum analyser for analysing an output of said spectrum analyser and producing a control signal dependent on said spectral information, said control signal causing adjustment of a parameter of said laser so as to tune said laser and produce said short stable pulses.

Another form of the invention provides a method of controlling a mode-locked semi-conductor laser to produce short stable pulses, characterised in that, said method includes the steps of monitoring the optical spectrum of the laser output to obtain spectral information, using said spectral information to produce a control signal, and controlling the laser by said control signal to produce said short stable pulses.

In order that the invention may be more readily understood, a particular embodiment will now be described with reference to the accompanying drawings wherein.

Figure 1:
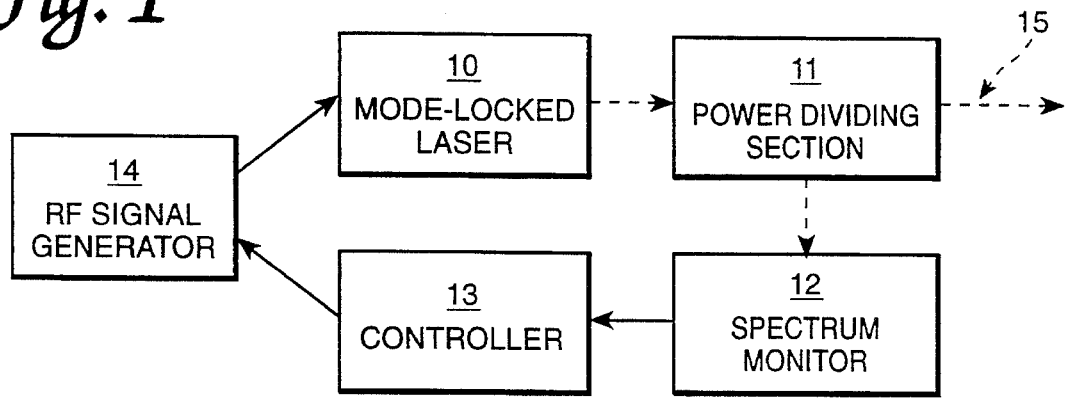
FIG. 1 is a general block diagram of a control system for a mode-locked laser, according to the invention.

The block diagram of FIG. 1 comprises a mode-locked laser (MLL) section 10, a power dividing section 11, a spectrum monitor section 12, a controller section 13 and an RF signal generator section 14. The various sections are connected as shown and as is evident the optical pulses generated by the mode-locked laser section 10 enter the power dividing section 11 which divides the optical power of the pulses between the optical output 15 and the spectrum monitor section 12.

The spectrum monitor section 12 analyses the optical spectrum of the pulse train and provides an electrical representation of the optical spectrum. The electrical representation of the spectrum is fed into the controller section 13. The controller section 13 is programmed to adjust the frequency of the RF signal generator section 14 from a knowledge of the optical spectrum to obtain the desired pulse characteristics from the mode-locked laser section 10. The output of the RF signal generator section 14 drives the mode-locked laser section 11, completing the control loop. Whilst according to this embodiment the controller section 13 adjusts the frequency of the RF signal generator section, in an alternative system, the controller section could control other parameters of the mode-locked laser section 10 to achieve the desired optimum pulse characteristics. For example, controlling the length of the mode-locked laser would have the same effect as controlling the frequency of the RF signal generator. Other controllable parameters include the RF power level, dc bias to the laser and the wavelength of the mode-locked laser.

Figure 2:
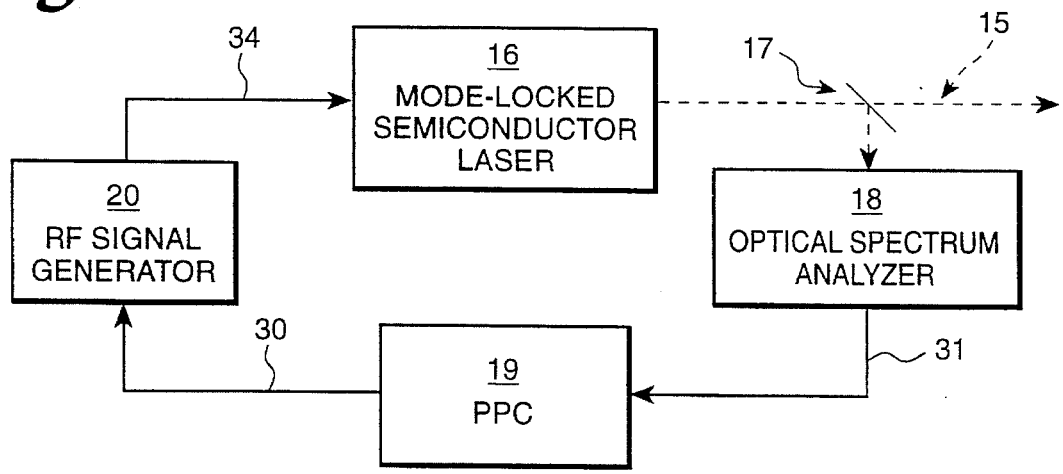
FIG. 2 is a more specific diagram similar to FIG. 1.

Referring now to the more specific block diagram of FIG. 2 which is in fact very similar to FIG. 1, a practical embodiment of the invention is disclosed. The mode-locked laser section comprises a mode-locked semiconductor laser and the power dividing section 11 now comprises a beamsplitter 17 to sample a small amount of the output of the laser 16. The main output optical pulse appears on output 15 as previously. The small amount of output is des to the monitor section which in this specific embodiment is an optical spectrum analyser (Anritsu Ms9001A1) 18 which allows the intensity at each wavelength to be monitored. The controller section in this case is a programmed personal computer 19 that analyses the output 31 of the optical spectrum analyser 18 and from the spectrum data information decides on whether the RF drive frequency on connection 34 should be altered. The RF signal generator 20 is of course controlled by the output 19 and provides the drive signal to the laser 16. Depending on the spectrum data, the computer adjusts the RF signal generator 20 by a control signal on connection 30. The RF signal generator is a Hewlett Packard 83640A which is adjusted to obtain the desired pulse characteristics.

Figure 3:
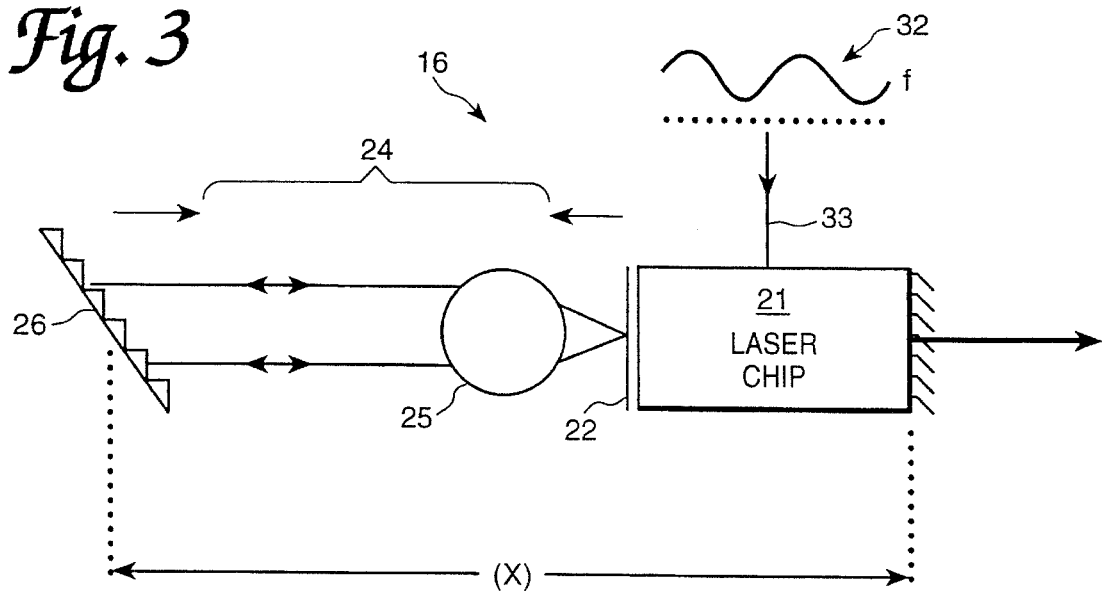
FIG. 3 is a schematic diagram of a mode-locked laser used in the control system of FIGS. 1 and 2.

Referring now to FIG. 3, there is shown in detail the mode-locked semiconductor laser 176 of FIG. 2 that generates the optical pulses. The laser 16 comprises a laser chip 21 with its rear facet coupled to an external cavity represented schematically within the bounds of the bracket 24. The rear facet 22 is coupled to an external cavity using, for example, an anti-reflection coated sphere lens 25. An external cavity mirror (not shown) is formed with a diffraction grating 26 or it may be a plane mirror. The laser chip 21 is supplied with a drive signal 33 which is an RF signal 32 superimposed on a constant dc bias using, for example, a commercial bias-tee. For a cavity length of 3.75 cm, represented by the length (X) in FIG. 3, the drive frequencies fRF are around 4 GHz at power levels up to 30 dBm.

Coupling between the laser 21 and the grating can be optimised by adjusting for minimum threshold current. Similarly, the grating angle is adjusted to minimise the threshold current, thereby ensuring that the device is operated close to the gain peak wavelength. The laser can be tuned by altering the cavity length and/or the RF drive frequency fRF. The dc bias and the RF drive power can also be altered for optimum performance.

Figure 4:
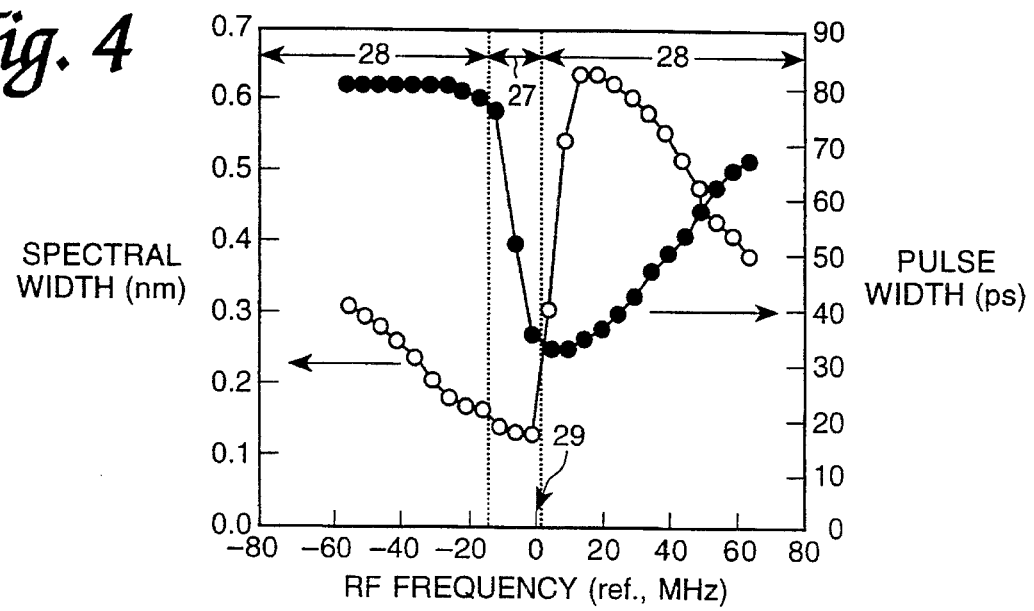
FIG. 4 is a graph demonstrating the tuning characteristics of the mode-locked laser of FIG. 3.

FIG. 4 shows a graph of measured optical pulse width and spectral width versus RF modulation frequency for the mode-locked laser of this embodiment. In the figure, stable region 27 and unstable regions 28, as measured on a sampling oscilloscope, are also indicated. The stable region 27 exists near the cavity resonance frequency. In unstable regions 28, the amplitude wavelength and timing of each optical pulse is unstable, making the pulse-train useless for many applications.

The graph of FIG. 4 shows that when the RF frequency is increased, the measured spectral width decreases from approx. 0.3 nm to approx. 0.1 nm and then suddenly increases to approx. 0.5 nm. This sudden increase corresponds to the pulses becoming unstable. The desired operating condition is situated at a point 29 just before the sudden broadening of the spectrum, and within the sable region. This graph shows that by monitoring the spectral width it is possible to set the RF frequency at the desired condition. To demonstrate an automatic tuning sequence, the personal computer 19 (the controller), was programmed to perform automatic tuning of the mode-locked laser.

Figure 5:
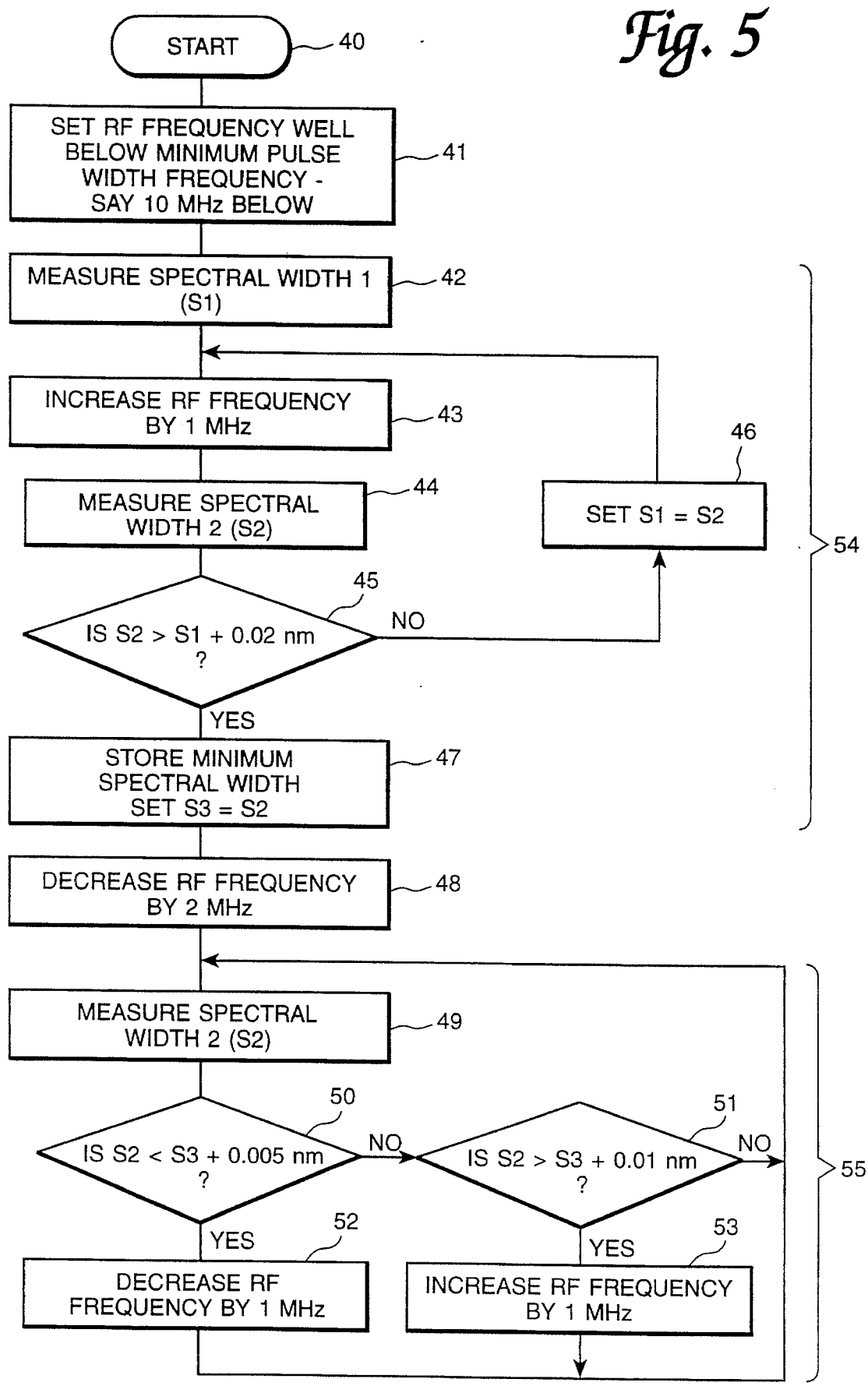
FIG. 5 is a flow chart of the control system according to the embodiment.

FIG. 5 shows a flow chart of the control sequence of the self-tuning mode-locked laser system. The labelling of the boxes of the flow chart is set forth below:
(40) Start
(41) Set RF frequency well below minimum pulsewidth frequency—say 10 MHz below
(42) Measure Spectral Width 1 (S1)
(43) Increase RF Frequency by 1 MHz
(44) Measure Spectral Width 2 (S2)
(45) is S2<S1+0.02 nm?
(46) Set S1=S2
(47) Store minimum spectral width Set S3=S1
(48) Decrease RF Frequency by 2 MHz
(49) Measure Spectral Width 2 (S2)
(50) is S2<S3+0.005 nm?
(51) is S2>S3+0.01 nm?
(52) Decrease RF Frequency by 1 MHz
(53) Increase RF Frequency by 1 MHz
(54) The steps of the algorithm within the bracket 54 find the approximate minimum spectral width by detecting sudden increase in spectral width.
(55) The steps of the algorithm within the bracket 55 maintain the spectral width between limits by adjusting the frequency keeping the laser within stable region.

The program controls the frequency of the RF signal generator 20 and monitors the spectral with as measured by the Anritsu spectrum analyser 18. The algorithm initially sets the RF frequency approximately 20 MHz below the desired operating frequency. This initial frequency can be judged approximately from the mode-locked laser cavity length X. The algorithm then searches for the frequency where a sudden increase in spectral width occurs; the search algorithm simply increases the RF frequency in 1 MHz steps and compares a new spectral width measurement (S2) with the previous measurement (S1). If the new spectral width is considerably larger than the old spectral width, then the search loop is exited and the minimum spectral width stored as S3. The RF frequency is then decreased by 2 MHz. The algorithm now adjusts the RF frequency to achieve a spectral width between two limits. If the spectral width is too low, with respect to S3, the RF frequency is decreased; if the spectral width is too high, with respect to S3, the RF frequency is increased. This control ensures that the laser is operated within the stable region 27, as indicated in FIG. 4.

Figure 6:
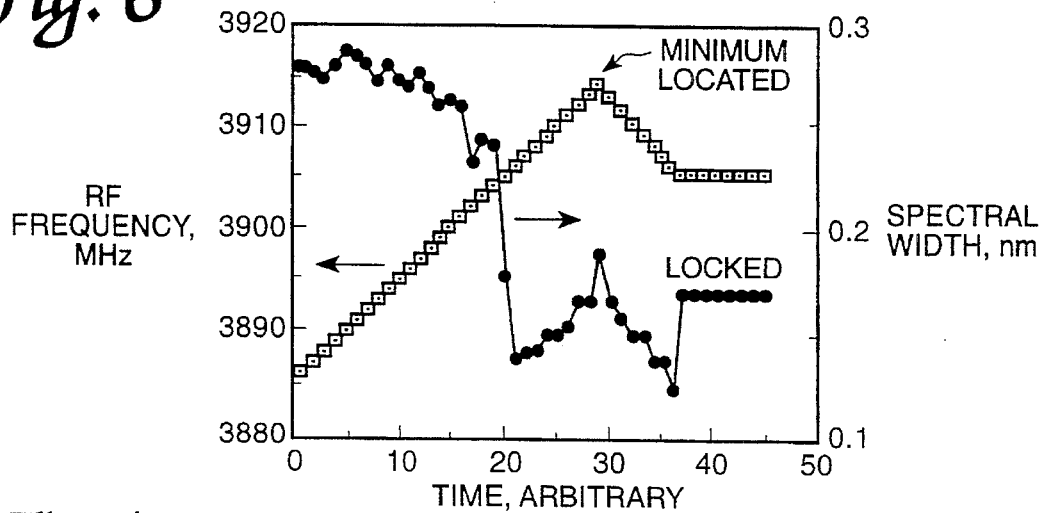
FIG. 6 is a graph showing RF frequency and spectral width as the laser is automatically tuned.

The graph of FIG. 6 shows the variation of the RF frequency and the spectral width obtained by running the algorithm of FIG. 5. This figure demonstrates that the system is able to tune by measuring the spectral width, rather than the temporal pulse width. The algorithm first sets the frequency to 3885 MHz, well below the frequency for minimum spectral width. The frequency is then increased in 1 MHz steps until a significant increase in spectral width is measured ('minimum located'). The frequency is then decreased by 2 MHz. The frequency is then reduced in 1 MHz steps until the spectral width increases just above the spectral width previous to that for the maximum RF frequency (i.e. the spectral width just before ('minimum located'). The RF frequency is then controlled to maintain the spectral width between these limits.

Figure 7:
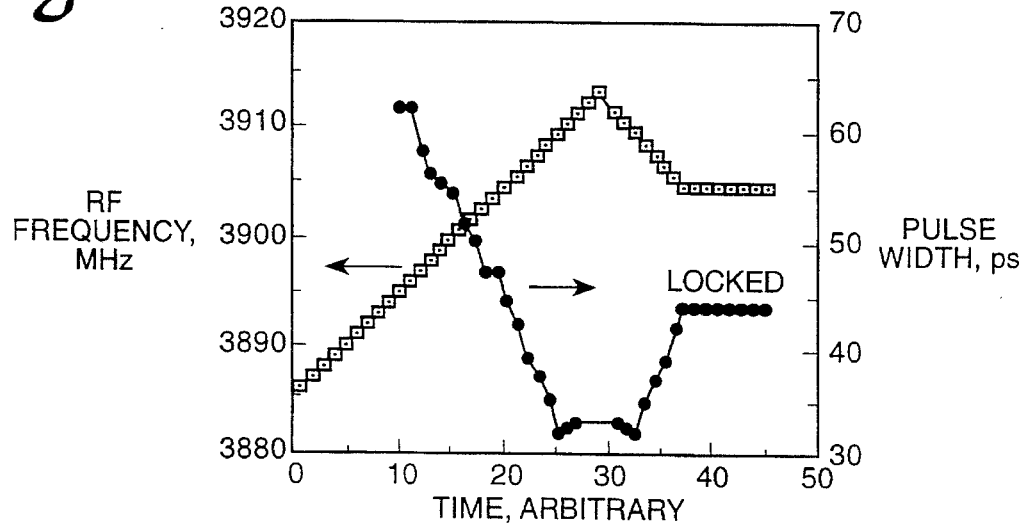
FIG. 7 is a graph showing RF frequency and pulse width as the laser is automatically tuned.

FIG. 7 shows the RF frequency and temporal pulse width as the algorithm was run on the system. The temporal width decreases as the RF frequency is initially increased. However, the pulse width increases as the RF frequency reaches its maximum value. After the minimum spectral width has been located, the RF frequency is decreased until the spectral width is between the control limits. When the spectral width is greater than the lower control limit, the RF frequency remains constant. At this point, the laser has achieved tuning, and gives stable, 44 ps FWHM pulses.

It should be evident from the description hereinabove that the present invention provides an improved control system for a mode-locked laser which renders the laser a self-tuning mode-locked laser. Furthermore, the invention provides an improved method for controlling a mode-locked laser to provide short stable pulses. It should be mentioned that short pulses in the context of this specification, are pulses in the order of say, less than 200 picoseconds. Preferably the pulses are in the order of less than about 50 picoseconds.

Of course it wall be readily evident to persons skilled in the art that the invention is not limited to the particular embodiment described by way of example hereinabove. Clearly the algorithm set forth in FIG. 5 is only one example of a suitable algorithm and it is envisaged that this algorithm could be improved with further development. Whilst the embodiment is described in relation to a semi-conductor laser, it is conceivable that the invention could be applied to other laser generators. In cases where the invention is applied to passive rather than active mode-locked lasers, the cavity length or dc baas current are examples of the parameters which could be adjusted for controlling pulse stability. Clearly, a grating, prism, or Etalon could also be used for monitoring the spectrum for the purpose of controlling pulse stability or pulse width.[00dc]A photodiode array is a still further option in this regard.

Because the method and apparatus used or controlling the mode-locked laser is inexpensive and portable, the present invention overcomes the problems or difficulties associated with producing short stable pulses as outlined in the introductory portion of this specification.

The claims defining the invention are as follows:

1. A mode-locked semi-conductor laser which produces short stable pulses including a feedback loop connected to an optical output of the laser, comprising RF signal producing means for producing a controllable laser light desired pulse output in response to a controllable parameter to tune said desired pulse output;

optical spectrum analyzer means for monitoring an optical spectrum of said optical output to obtain spectral information; and controller means connected to said spectrum analyzer means for analyzing an output of said spectrum analyzer means and for producing a control signal dependent on said spectral information, said control signal being provided to said RF signal producing means to adjust said controllable parameter, to tune said producing means and to produce said desired short stable pulses.

2. A mode-locked semi-conductor laser as defined in claim 1, wherein said producing means has an external cavity and wherein said controllable parameter is the length of said cavity.

3. A mode-locked semi-conductor laser as defined in claim 2, wherein said control signal causes adjustment of pulse stability.

4. A mode-locked semi-conductor laser as defined in claim 2, wherein said control signal causes adjustment of pulse width.

5. A mode-locked semi-conductor laser as defined in claim 2, wherein said spectral information comprises spectral wavelength.

6. A mode-locked semi-conductor laser as defined in claim 2, wherein said spectral information comprises spectral width.

7. A mode-locked semi-conductor laser as defined in claim 2, wherein said spectral information comprises spectral shape.

8. A mode-locked semi-conductor laser as defined in claim 1, wherein said producing means comprises an RF signal generator means for receiving said control signal and producing a drive signal, comprising an RF signal superimposed on a constant dc bias signal, and wherein said controllable parameter comprises the frequency of said RF signal.

9. A mode-locked semi-conductor laser as defined in claim 8, wherein said control signal causes adjustment of pulse stability.

10. A mode-locked semi-conductor laser as defined in claim 8, wherein said control signal causes adjustment of pulse width.

11. A mode-locked semi-conductor laser as defined in claim 8, wherein said spectral information comprises spectral wavelength.

12. A mode-locked semi-conductor laser as defined in claim 8, wherein said spectral information comprises spectral width.

13. A mode-locked semi-conductor laser as defined in claim 8, wherein said spectral information comprises spectral shape.

14. A mode-locked semi-conductor laser as defined in claim 1, wherein said optical spectrum analyser means comprises a beam splitter located in a path of said optical output of said laser to provide a small amount of said optical output to said spectrum analyser means.

15. A mode-locked semi-conductor laser as defined in claim 1, wherein said controller means comprises a microcontroller for analyzing the output of said spectrum analyzer means.

16. A mode-locked semi-conductor laser as defined in claim 1, wherein said producing means comprises an RF signal generator means for receiving said control signal and producing a drive signal comprising an RF signal superimposed on a constant dc bias signal, and wherein said controllable parameter comprises the power of said RF signal.

17. A mode-locked semi-conductor laser as defined in claim 1, wherein said producing means comprises an RF signal generator means for receiving said control signal and producing a drive signal comprising an RF signal superimposed on a constant dc bias signal, and wherein said controllable parameter comprises said constant dc bias.

18. A mode-locked semi-conductor laser as defined in claim 1, wherein said controller means comprises a microcomputer for analyzing the output of said spectrum analyzer means.

19. A method of controlling a mode locked semi-conductor laser to produce desired short stable pulses comprising the steps of:

producing a controllable laser light desired pulse output in response to a controllable parameter to tune said desired pulse output;

monitoring an optical spectrum of a laser output to obtain spectral information;

analyzing an output produced from said spectral information;

producing a control signal dependent on said spectral information; and providing said control signal to an RF signal producer to adjust said controllable parameter, to tune said signal producer and to produce said desired short stable pulses.

20. A method according to claim 19, wherein said step of monitoring the optical spectrum includes the substep of monitoring the spectral width, and wherein said providing step includes the substep of controlling an RF drive signal of the laser to maintain said spectral width substantially at a minimum value, whereby said laser is operated within a stable region.

21. A method according to claim 20, further comprising the steps of:

setting said RF drive signal below a desired operating frequency of the laser;

determining the approximate minimum spectral width by increasing the drive signal frequency in discrete steps, measuring the spectral width after each step and comparing each measurement with the previous measurement until there is a substantial increase in spectral width between successive measurements;

storing the measurement representing the minimum spectral width;

decreasing the RF drive signal frequency by a predetermined amount to establish a lower limit; and adjusting said RF frequency to achieve a spectral width between said minimum spectral width and said lower limit so as to ensure operation of said laser within said stable region.

22. A method according to claim 19, wherein said step of monitoring the optical spectrum includes the substep of monitoring the spectral wavelength of said output and wherein said provident step includes the substep of controlling the pulse width of said laser output.

23. A method according to claim 19, wherein said step of monitoring the optical spectrum includes the substep of monitoring the spectral wavelength of said output.

* * * * *